United States Patent [19]
Okamoto

[11] Patent Number: 5,446,693
[45] Date of Patent: Aug. 29, 1995

[54] SEMICONDUCTOR STORAGE DEVICE

[75] Inventor: Toshiharu Okamoto, Tokyo, Japan

[73] Assignee: NEC Corporation, Tokyo, Japan

[21] Appl. No.: 310,311

[22] Filed: Sep. 22, 1994

[30] Foreign Application Priority Data

Sep. 22, 1993 [JP] Japan ................................. 5-236385

[51] Int. Cl.⁶ ............................................ G11C 7/00
[52] U.S. Cl. ............................. 365/200; 365/225.7; 365/230.03; 365/230.06
[58] Field of Search ................ 365/200, 225.7, 230.06, 365/230.03; 371/10.2, 10.3

[56] References Cited
U.S. PATENT DOCUMENTS

| | | |
|---|---|---|
| 5,046,046 | 9/1991 | Sweha et al. ........................... 365/200 |
| 5,060,197 | 10/1991 | Park et al. ............................. 365/200 |
| 5,295,114 | 3/1994 | Kobayashi ....................... 365/230.06 |

Primary Examiner—Joseph A. Popek
Attorney, Agent, or Firm—Sughrue, Mion, Zinn, Macpeak & Seas

[57] ABSTRACT

The object of the present invention is to enhance the productivity of semiconductor storage devices by increasing the scale of a redundancy circuit. Semiconductor storage device 1 is different from a conventional semiconductor storage device in that it includes six fuse circuits, and six row pre-decoders connected in a one-by-one relationship to six fuse circuits by way of first to six pre-row lines, respectively, and one of six fuse circuits is selected by six row pre-decoders, and redundancy switching information is written into each of fuse circuits.

4 Claims, 6 Drawing Sheets

SEMICONDUCTOR STORAGE DEVICE

BACKGROUND OF THE INVENTION

1. Field of the Invention

This invention relates to a semiconductor storage device, and more particularly to a semiconductor storage device having memory cells formed from non-volatile transistors.

2. Description of the Related Art

In order to achieve high efficiency in productivity of semiconductor storage devices (semiconductor memories), it is crucial to enhance the yield in production of chips. However, as semiconductor memories continue to increase in capacity as a result of the advance of a fine working techniques in recent years, pattern defects caused by dust or similar foreign matter have also progressively increased, with the result that many chips are selectively determined to be unacceptable because several defective memory cells are produced in a memory cell block, or a row line or a column line is disconnected or short-circuited by a pattern defect. Therefore, potential for increased productivity by enhancement of the yield in production of chips is approaching its limit. Here, a redundancy relief method is commonly employed as a means of changing unacceptable chips to acceptable articles. According to this method, spare memory cells and a redundancy control circuit are provided in a chip so that defective memory cells may be replaced with the spare memory cells.

The redundancy relief method is a method wherein, for example, spare memory cells for column lines, spare memory cells for row lines, fuse circuits for column line redundancy switching information, fuse circuits for row line redundancy switching information and a redundancy switching control circuit are provided, and redundancy switching information is stored in advance in the fuse circuits. Defective memory cells are replaced with the column line spare memory cells or the row line spare memory cells in accordance with the redundancy switching information.

In a volatile memory integrated circuit such as a DRAM or an SRAM, polycrystalline silicon is normally used for fuse elements constituting a fuse circuit. In this instance, an inspection step of chips is time consuming because a step of fusing polycrystalline silicon using a laser or some other suitable means to store redundancy switching information is required before the fuse element is enclosed into a package. In contrast, in an EPROM or a flash memory which is a non-volatile memory integrated circuit, memory cells are constituted from electrically writable non-volatile transistors. In addition, a fuse circuit can be constructed using a fuse element constituted from a non-volatile transistor. Because redundancy switching information can be electrically written into a fuse circuit, a fuse circuit can be easily used in taking the counter-measure of redundancy switching relief against unacceptable chips. However, since fuse circuits, a fuse circuit write voltage supply circuit and a fuse circuit write control circuit are required, the area occupied by those peripheral circuits tends to be large.

Further, with the increase in capacity of CPUs in recent years, there has been an increasing demand for semiconductor memory integrated circuits of a multi-bit output configuration, and a large-scale redundancy switching construction must be adopted in accordance with a multi-bit output configuration. This has resulted in an increase in the area occupied by peripheral circuits, and consequently, a further increase in the size of the chips.

FIG. 1 is a block diagram showing an example of a conventional semiconductor storage device having memory cells formed from non-volatile transistors.

Semiconductor storage device 100 includes two memory cells $120_1$ and $120_2$, two column line spare memory cell blocks $121_1$ and $121_2$, six row pre-decoders $110_1$ to $110_6$, address buffer 111, twelve row decoders $112_{11}$ to $112_{62}$ from each of which four column lines are outputted, two column selectors $113_1$ and $113_2$ from each of which four column lines are outputted, two redundancy switching circuits $114_1$ and $114_2$ from each of which a single spare column line is outputted, two sense amplifiers $115_1$ and $115_2$, a redundancy switching control circuit 116, a fuse circuit write control circuit 117, six fuse circuits $118_1$ to $118_6$, and a fuse circuit write voltage supply circuit 119. Here, redundancy switching circuits $114_1$ and $114_2$, redundancy switching control circuit 116, fuse circuit write control circuit 117 and fuse circuits $118_1$ to $118_6$ function as a redundancy circuit for replacing column line memory cells including defective memory cells produced in memory cell blocks $120_1$ and $120_2$ with column line spare memory cells in column line spare memory cell blocks $121_1$ and $121_2$.

Memory cell block $120_1$ on the left side of FIG. 1 is constituted from $4 \times 4 \times 6 = 96$ memory cells constituted from non-volatile transistors arranged at cross points between four row lines outputted from each of row decoders $112_{11}$ to $112_{61}$ and four column lines outputted from column selector $113_1$. It is to be noted that "column line memory cells" denotes four memory cells arranged at cross points between four row lines outputted, for example, from row decoder $112_{11}$ and one column line outputted from column selector $113_1$. Memory cell block $120_2$ on the right side of FIG. 1 is constructed in a similar manner to memory cell block $120_1$.

Column line spare memory cell block $121_1$ on the left side of FIG. 1 is constituted from $4 \times 1 \times 6 = 24$ spare memory cells constituted from non-volatile transistors arranged at cross points between four row lines outputted from each of column decoders $112_{11}$ to $112_{61}$ and one spare column line outputted from redundancy switching circuit $114_1$, and is constituted from six column line spare memory cells for switching by column line memories including defective memory cells produced in memory cell block $120_1$. It is to be noted that "column line spare memory cells" denotes four spare memory cells arranged, for example, at cross points between four row lines outputted from row decoder $112_{11}$ and one spare column line outputted from redundancy switching circuit $114_1$. Column line spare memory block $121_2$ on the right side of FIG. 1 is constructed in a similar manner to column line spare memory cell block $121_1$.

Six row pre-decoders $110_1$ to $110_6$ are connected to address buffer 111 by way of first address signal lines $L_{AD1}$ and select rows of memory cell blocks $120_1$ and $120_2$. Twelve row decoders $112_{11}$ to $112_{62}$ are connected two-to-one to row pre-decoders $110_1$ to $110_6$ by way of first to sixth pre-row lines $L_{PC1}$ to $L_{PC6}$, respectively. Specifically, row decoder $112_{11}$ and row decoder $112_{12}$ are connected to row pre-decoder $110_1$ by way of first pre-row line $L_{PC1}$; row decoder $112_{21}$ and row decoder $112_{22}$ are connected to row pre-decoder $110_2$ by way of second pre-row line $L_{PC2}$; row decoder $112_{31}$ and row decoder $112_{32}$ are connected to row pre-decoder $110_3$ by way of third pre-row line $L_{PC3}$; row decoder $112_{41}$ and row decoder $112_{42}$ are connected to row pre-decoder $110_4$ by way of fourth pre-row line $L_{PC4}$; row decoder $112_{51}$ and row decoder $112_{52}$ are connected to row pre-decoder $110_5$ by way of fifth pre-row line $L_{PC5}$; and row decoder $112_{61}$ and row decoder $112_{62}$ are connected to row pre-decoder $110_6$ by way of sixth pre-row line $L_{PC6}$.

Two column selectors $113_1$ and $113_2$ are provided to select columns of memory cell blocks $120_1$ and $120_2$, respectively. Here, column selector $113_1$ on the left side of FIG. 1 is connected to address buffer 111 by way of first column address signal line $L_{RAD1}$ and connected to redundancy switching circuit $114_1$ on the left side of FIG. 1 by way of first data line $L_{D1}$. Meanwhile, column selector $113_2$ on the right side of FIG. 1 is connected to address buffer 111 by way of first column address signal line $L_{RAD1}$ and connected to redundancy switching circuit $114_2$ on the right side of FIG. 1 by way of second data line $L_{D2}$.

The two redundancy switching circuits $114_1$ and $114_2$ are provided to replace data from memory cell blocks $120_1$ and $120_2$ with data from spare memory cell blocks $121_1$ and $121_2$, respectively. Here, redundancy switching circuit $114_1$ on the left side of FIG. 1 is connected to sense amplifier $115_1$ on the left side of FIG. 1 by way of third data line $L_{D3}$ and connected to redundancy switching control circuit 116 by way of first control signal line $L_{C1}$. Meanwhile, redundancy switching circuit $114_2$ on the right side of FIG. 1 is connected to sense amplifier $115P_2$ on the right side of FIG. 1 by way of fourth data line $L_{D4}$ and connected to redundancy switching control circuit 116 by way of second control signal line $L_{C2}$.

Redundancy switching control circuit 116 refers to redundancy switching information written in fuse circuits $118_1$ to $118_6$ and provides to redundancy switching circuits $114_1$ and $114_2$ an instruction as to whether or not data from memory cell blocks $120_1$ and $120_2$ should be switched to data from spare memory cell blocks $121_1$ and $121_2$, respectively. It is to be noted that redundancy switching control circuit 116 is connected to address buffer 111 by way of second column address signal line $L_{RAD2}$ and connected to fuse circuits $118_1$ to $118_6$ by way of eleventh to sixteenth signal lines $L_{S11}$ to $L_{S16}$, respectively.

Six fuse circuits $118_1$ to $118_6$ are constituted from fuse elements formed from non-volatile transistors having the same structure as the memory cells described above and are provided so that redundancy switching information may be provided therein. It is to be noted that fuse circuits $118_1$ to $118_6$ are connected to fuse circuit write voltage supply circuit 119, and are also connected to fuse circuit write control circuit 117 by way of 21st to 26th signal lines $L_{S21}$ to $L_{S26}$, respectively.

Fuse circuit write control circuit 117 is provided to write redundancy switching information into fuse circuits $118_1$ to $118_6$ and is connected to address circuit 111 by way of second address signal line $L_{AD2}$. Meanwhile, fuse circuit write voltage supply circuit 119 is provided to supply to fuse circuits $118_1$ to $118_6$ a voltage necessary to write redundancy switching information.

Next will be described redundancy switching control of semiconductor storage device 100.

In a read mode, one of six row pre-decoders $110_1$ to $110_6$ is selected in response to a row address signal outputted from address buffer 111 on first address signal line $L_{AD1}$. If it is assumed that, for example, row pre-decoder $110_1$ shown uppermost in FIG. 1 is selected, one of the four row lines outputted from each of row decoders $112_{11}$ and $112_{12}$ is selected by row decoders $112_{11}$ and $112_{12}$ which are connected to thus selected row pre-decoder $110_1$ by way of first pre-row line $L_{PC1}$.

In column selector $113_1$ on the left side of FIG. 1, one of the four column lines of memory cell block $120_1$ on the left side of FIG. 1 is selected in response to a first column address signal outputted from address buffer 111 on first column address signal line $L_{RAD1}$, and data on the selected column line are outputted to redundancy switching circuit $114_1$ on the left side of FIG. 1. In redundancy switching circuit $114_1$, data switching between data from column selector $113_1$ and data from column line spare memory cell block $121_1$ is performed in response to a first control signal outputted from redundancy switching control circuit 116 on first control signal line $L_{C1}$, and the data are outputted to sense amplifier $115_1$ on the left side of FIG. 1. Sense amplifier $115_1$ amplifies the data transmitted thereto from redundancy switching circuit $114_1$ and outputs the amplified data to an output buffer circuit (not shown). Column selector $113_2$, redundancy switching circuit $114_2$ and sense amplifier $115_2$ shown on the right side of FIG. 1 operate in a manner similar to that described above.

Redundancy switching control circuit 116 produces first and second control signals instructing which column line memory cells of memory cell blocks $120_1$ and $120_2$ should be replaced with column line spare memory cells in accordance with the redundancy switching information written in fuse circuits $118_1$ to $118_6$. The thus-produced first and second control signals are outputted to redundancy switching circuits $114_1$ and $114_2$ by way of first and second control signal lines $L_{C1}$ and $L_{C2}$, respectively.

If a defective memory cell is found, for example, in memory cell block $120_1$ on the left side of FIG. 1 during an inspection step before shipment, redundancy switching information instructing the replacement of column line memory cells including the thus-found defective memory cell with column line spare memory cells in column line spare memory cell block $121_1$ must be written into fuse circuits $118_1$ to $118_6$. In such a redundancy switching information write mode, a high voltage necessary to write is supplied from fuse circuit write voltage supply circuit 119 to fuse circuits $118_1$ to $118_6$, and redundancy switching information is selectively written into fuse circuits $118_1$ to $118_6$ by fuse circuit write control circuit 117 in accordance with an address signal outputted from address buffer 111 to second address signal line $L_{AD2}$.

However, in the semiconductor storage device 100 described above (a semiconductor memory integrated circuit such as, for example, an EPROM or a flash memory), while a redundancy switching countermeasure can be easily performed during an inspection step, the necessity for a fuse circuit write voltage supply circuit 119, fuse circuit write control circuit 117 and other circuits tends to increase the area occupied by the peripheral circuits. If large-scale configuration of redundancy circuits is considered in the future, the increase in chip size will result in lower productivity or lower yield in production, with the result that productivity cannot be improved.

The crucial component in realizing a large-scale redundancy circuit is the fuse circuit write control circuit. While the fuse circuit write control circuit is not directly involved when a user uses the memory product, its function is essential for selecting a fuse circuit into which redundancy switching information should be written for replacing defective memory cells with spare memory cells. Another significant obstacle to reducing chip size is the wiring from the address buffer, since a fuse circuit write control signal necessary to select a fuse circuit by means of the fuse circuit write control circuit is obtained by way of address input terminals.

3. Summary of the Invention

It is an object of the present invention to provide a semiconductor storage device by which improvement in productivity can be achieved even if a redundancy circuit is increased in scale.

A semiconductor storage circuit according to the present invention includes:

a memory cell block in which memory cells formed from non-volatile transistors are arranged two-dimensionally, a spare memory cell block constituted from a plurality of spare memory cells to be replaced defective memory cells produced in the memory cell block, a plurality of row pre-decoder circuits for selecting a row of the memory cell block, a plurality of fuse circuits which are constituted from fuse elements formed from non-volatile transistors of the same structure as those of the memory cells and which are adapted to write redundancy switching information therein, a fuse circuit write voltage supply circuit for supplying to the fuse circuits a voltage necessary to write the redundancy switching information, a redundancy switching circuit for switching data from the memory cell block to data from the spare memory cell block, and a redundancy switching control circuit for referring to the redundancy switching information written in the fuse circuits to provide to the redundancy switching circuit an instruction whether or not the data from the memory cell block should be switched to the data from the spare memory cell block;

and is characterized in that:

the plurality of row pre-decoder circuits and the plurality of fuse circuits are connected in a one-by-one corresponding relationship to each other, and one of the plurality of fuse circuits is selected by the plurality of row pre-decoder circuits and the redundancy switching information is written into each of the fuse circuits.

In the semiconductor storage device of the present invention, the plurality of row pre-decoder circuits and the plurality of fuse circuits are connected to each other in a one-by-one corresponding relationship, and one of the plurality of fuse circuits is selected by the plurality of row pre-decoder circuits, and redundancy switching information is written into each fuse circuit. Consequently, there is no necessity for a fuse circuit write control circuit and associated wiring lines which are conventionally required to write redundancy switching information into the fuse circuits.

DETAILED DESCRIPTION OF THE PREFERRED EMBODIMENTS

Embodiments of the present invention are described below with reference to the drawings.

Figure 2:
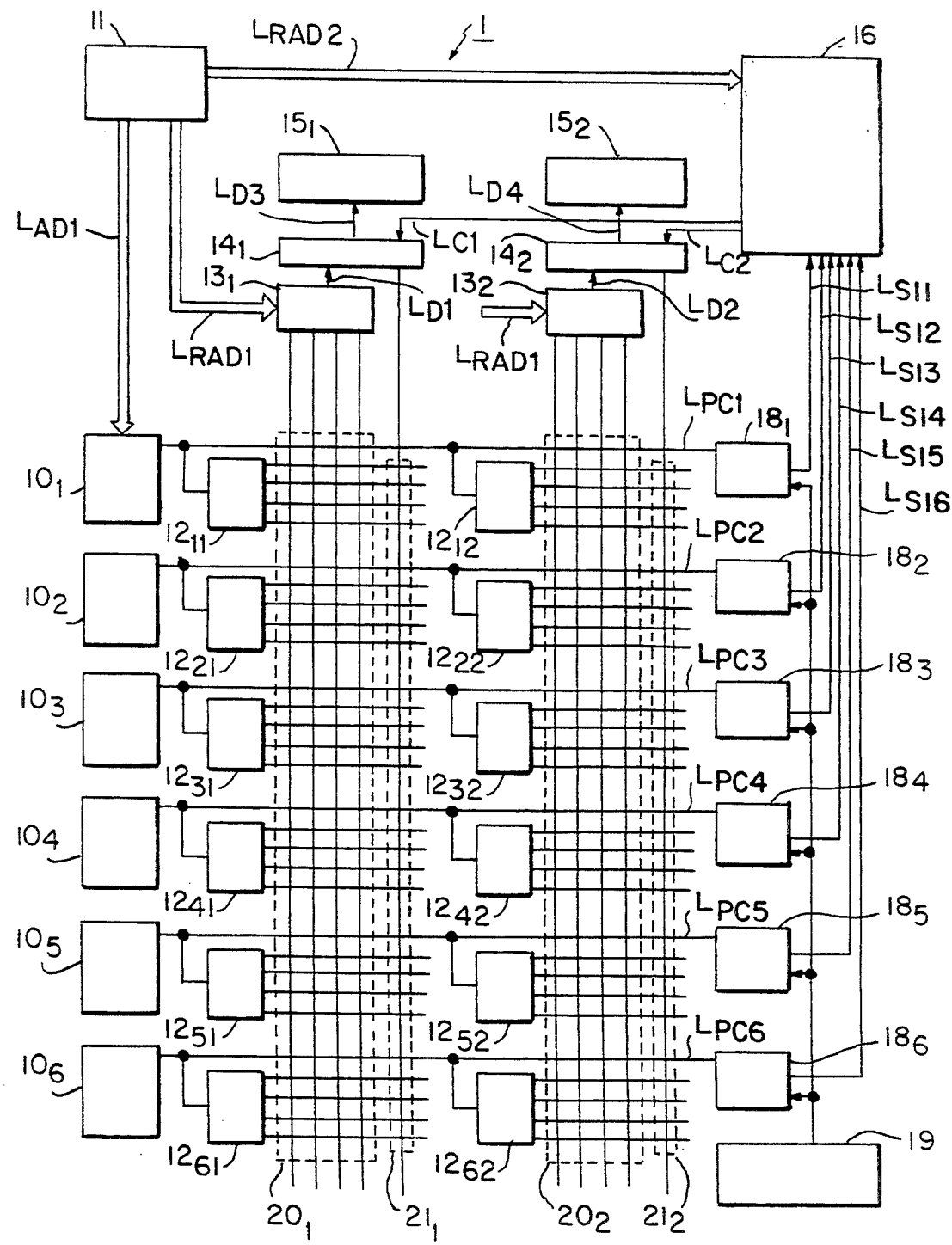
FIG. 2 is a block diagram showing the construction of an embodiment of a semiconductor storage device of the present invention.

FIG. 2 is a block diagram showing the construction of an embodiment of a semiconductor storage device of the present invention.

Figure 1:
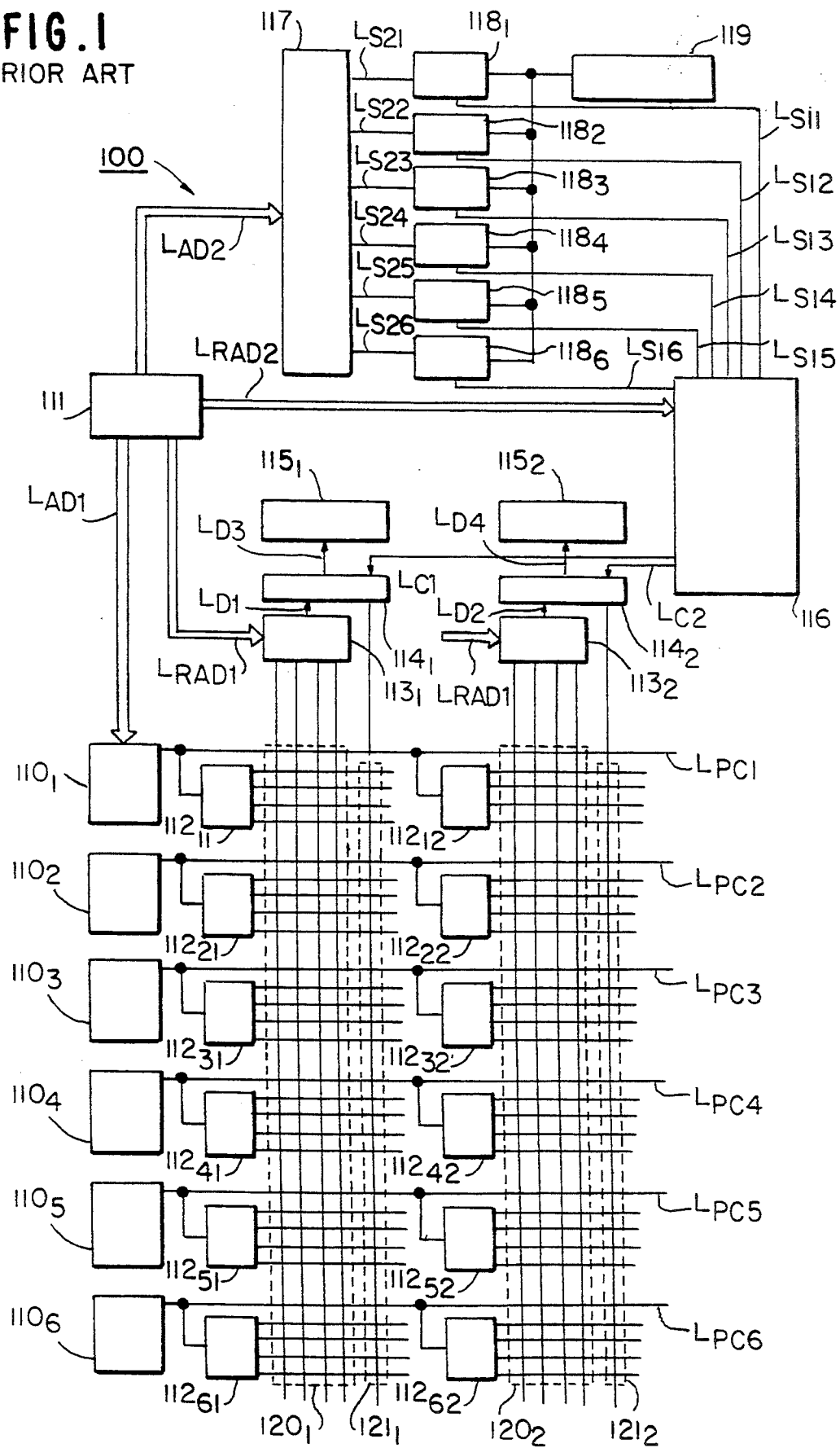
FIG. 1 is a block diagram showing an example of a conventional semiconductor storage device having memory cells constituted from non-volatile transistors.

Semiconductor storage device 1 is different from conventional semiconductor storage device 100 shown in FIG. 1 in that six fuse circuits $18_1$ to $18_6$ are connected in a one-by-one corresponding relationship to six row pre-decoders 101 to 106 by way of first to sixth pre-row lines $L_{PC1}$ to $L_{PC6}$, respectively, and one of the six fuse circuits $18_1$ to $18_6$ is selected by [a corresponding one of the] six row pre-decoders $10_1$ to $10_6$, and redundancy switching information is written into each of fuse circuits $18_1$ to $18_6$.

Redundancy switching control of the semiconductor storage device 1 will next be described.

In a redundancy switching information write mode, redundancy switching information, which instructs which column line memory cells of memory cell blocks $20_1$ and $20_2$ should be replaced with column line spare memory cells in column line spare memory cell blocks $21_1$ and $21_2$, is written into fuse circuits $18_1$ to $18_6$ in the following manner. Each fuse circuit $18_1$ to $18_6$ is constructed using a fuse element formed from a non-volatile transistor and is capable of having redundancy switching information electrically written into it. Selective write control determines the fuse circuit of fuse circuits $18_1$ to $18_6$ into which redundancy switching information should be written and is performed by selecting one of six row pre-decoders $10_1$ to $10_6$ by means of address buffer 11. As an example, when row pre-decoder $10_1$ shown uppermost in FIG. 2 is selected by address buffer 11, redundancy switching information is written into fuse circuit 181 which is connected to row predecoder $10_1$ by way of first pre-row line $L_{PC1}$. It is to be noted that, in this instance, a high voltage necessary to write is supplied from fuse circuit write voltage supply circuit 19 to fuse circuits $18_1$ to $18_6$.

Redundancy switching control circuit 16 refers to the redundancy switching information written in fuse circuits $18_1$ to $18_6$ and compares the fuse circuit in which the redundancy switching information is written with a column address which was inputted by a user when semiconductor storage device 1 was in a read mode or a write mode. If the column address where defective memory cells are present is used, redundancy switching control circuit 16 outputs to redundancy switching circuits $14_1$ and $14_2$ first and second control signals instructing that column line memory cells including the defective memory cells be replaced with column line spare memory cells in column line spare memory cell blocks $21_1$ and $21_2$, respectively.

Each of memory cell blocks $20_1$ and $20_2$ has four columns of column line memory cells. Accordingly, one bit of information is required to indicate whether or not, for example, memory cell block $20_1$ on the left side of FIG. 2 uses column line spare memory cell block $21_1$, and, if redundancy switching is performed for memory cell block $20_1$, two bits of information are required to indicate which column address is replaced. Consequently, a fuse circuit of 3 bits is required for redundancy switching control of one circuit. As a result, for two memory cell blocks $20_1$ and $20_2$, fuse circuits $18_1$ to $18_6$ for 3 bits$\times 2=6$ bits are required.

Figure 3:
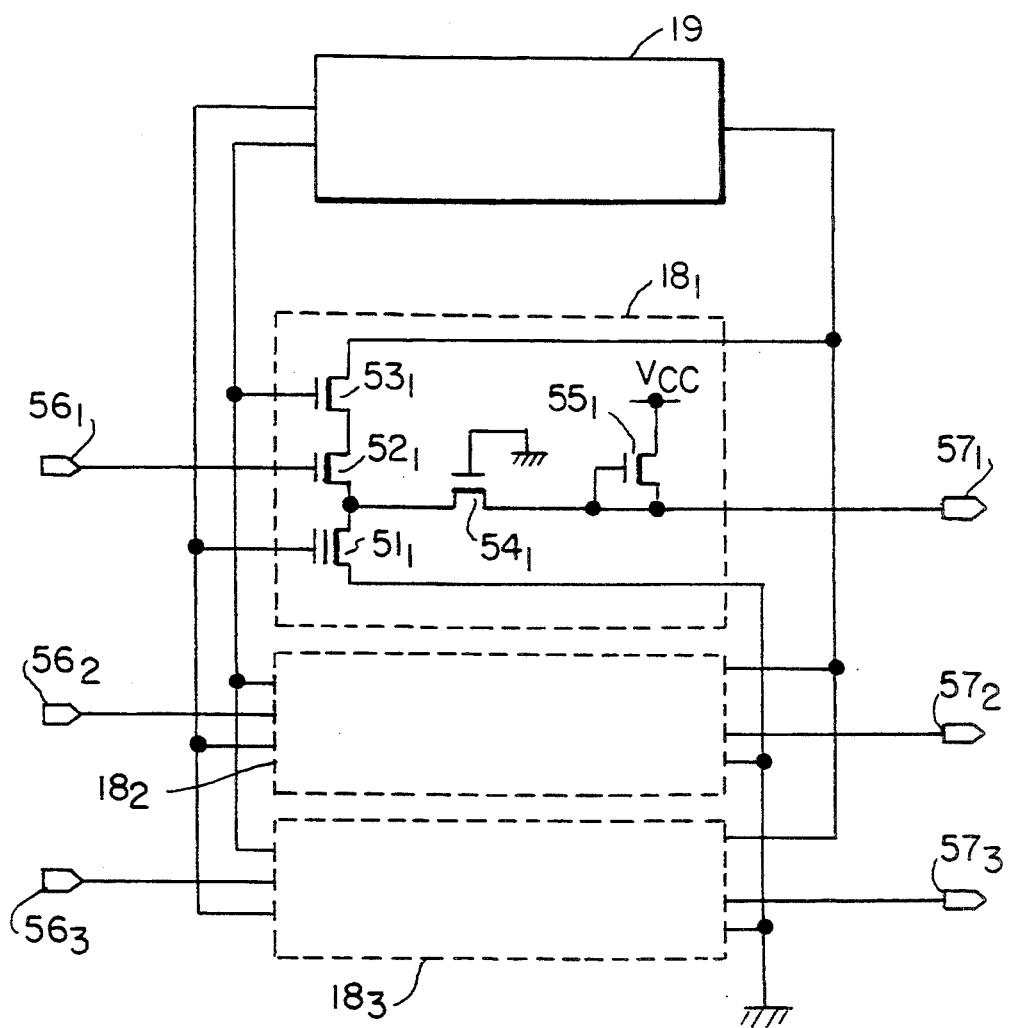
FIG. 3 is a block diagram showing an example of the construction of a fuse circuit shown in FIG. 2.

FIG. 3 is a block diagram showing an example of the construction of fuse circuit $18_1$ shown in FIG. 2.

Fuse circuit $18_1$ includes memory cell $51_1$, first enhancement type transistor $52_1$ formed from nMOS, second enhancement type transistor $53_1$ formed from nMOS, first depletion type transistor $54_1$ formed from nMOS, and second depletion type transistor $55_1$ formed from nMOS.

Here, memory cell $51_1$ is produced by the same process and has the same structure as the memory cells constituting memory cell blocks $20_1$ and $20_2$ shown in FIG. 2, and the source thereof is grounded. The source of first enhancement type transistor $52_1$ is connected to the drain of memory cell $51_1$. The source of second enhancement type transistor $53_1$ is connected to the drain of first enhancement type transistor $52_1$. Meanwhile, the gate of second enhancement type transistor $53_1$ is connected to row pre-decoder $10_1$ by way of input terminal $56_1$ and first pre-row line LPC1 shown in FIG. 2. The gate of memory cell $51_1$ and the drain and the gate of second enhancement type transistor $53_1$ are connected independently of one another to fuse circuit write voltage supply circuit 19. Further, the drain of memory cell $51_1$ is connected to output terminal $57_1$ by way of first depletion type transistor $54_1$, the gate of which is grounded. The gate and the drain of second depletion type transistor $55_1$ are connected to output terminal $57_1$, and the source of second depletion type transistor $55_1$ is always held at power source voltage level VCC.

The operation of fuse circuit $18_1$ of the present construction example will next be described.

In a redundancy switching information write mode, high voltages are supplied independently of one another from fuse circuit write high voltage supply circuit 19 to the gate and the drain of second enhancement type transistor $53_1$ and the gate of memory cell $51_1$. Then, when first pre-row line $L_{PC1}$ is selected by row predecoder $10_1$, a high voltage is applied to the gate of first enhancement type transistor $52_1$ connected to row pre-decoder $10_1$ by way of selected first pre-row line $L_{PC1}$. As a result, first enhancement type transistor $52_1$ is turned on. Consequently, the high voltage is applied to the drain of memory cell $51_1$ so that electrons are injected into the floating gate of memory cell $51_1$ to write redundancy switching information into memory cell $51_1$.

In a read mode or a write mode, the gate of memory cell $51_1$ is held at power source voltage level $V_{CC}$ by fuse circuit write voltage supply circuit 19, and the gate of second enhancement type transistor $53_1$ is grounded.

In this instance, the drain of second enhancement type transistor $53_1$ may be at any potential. If redundancy switching information is written in memory cell $51_1$, memory cell $51_1$ has a high threshold level, and consequently, memory cell $51_1$ is in a non-conducting condition. Accordingly, in this instance, an output signal of a low level is outputted from output terminal $57_1$. In contrast, if redundancy switching information is not written in memory cell $51_1$, the threshold level of memory cell $51_1$ remains as it is, and consequently, memory cell $51_1$ remains in a conducting condition. Accordingly, in this instance, memory cell $51_1$ is charged by second depletion type transistor $55_1$, and consequently, an output signal of a high level is outputted from output terminal $57_1$. It is to be noted that first depletion type transistor $54_1$ acts to prevent the high voltage applied to the drain of memory cell $51_1$ from being applied to output terminal $57_1$ when redundancy switching information is written into memory cell $51_1$.

The construction and operation of the other fuse circuits $18_2$ to $18_6$ are similar to the construction and operation of fuse circuit $18_1$ described above.

Figure 4:
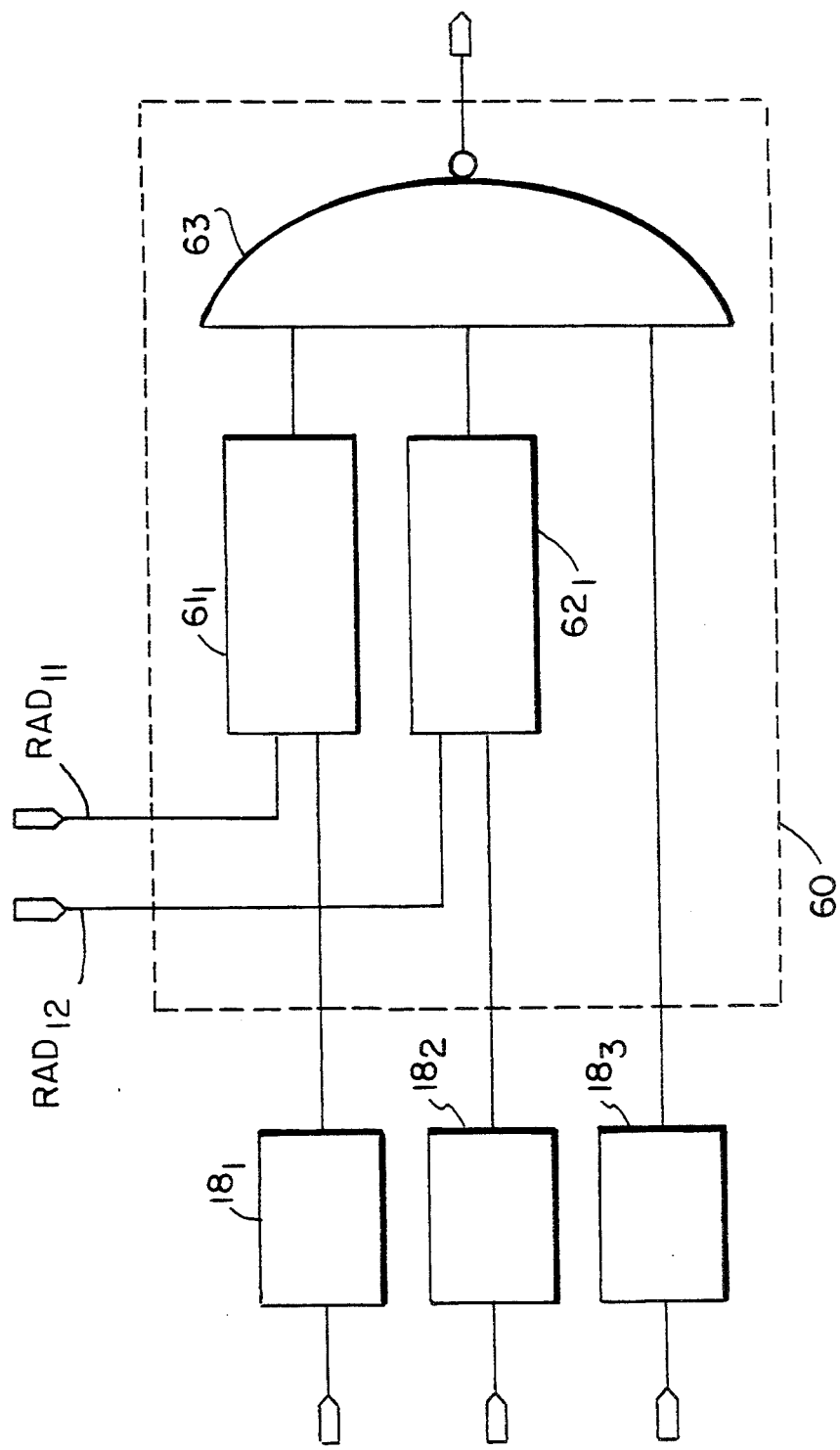
FIG. 4 is a block diagram showing a redundancy switching control circuit block for explaining an example of the construction of the redundancy switching control circuit shown in FIG. 2.

FIG. 4 is a block diagram showing redundancy switching control circuit block 60 for explaining an example of the construction of the redundancy switching control circuit 16 shown in FIG. 2. It is to be noted that redundancy switching control circuit block 60 shown in FIG. 4 is shown for one circuit for performing column redundancy switching control of each of memory cell blocks $20_1$ and $20_2$, and redundancy switching control circuit 16 is constructed by providing two redundancy switching control circuit blocks 60.

Redundancy switching control circuit block 60 includes two redundancy switching information comparison circuits $61_1$ and $62_1$ and a three-input NAND circuit 63. Here, the output signal of fuse circuit $18_1$ shown in FIG. 2 and column address $R_{AD11}$ from address buffer 11 are inputted to redundancy switching information comparison circuit $61_1$ shown in the upper portion of FIG. 4. The output signal of fuse circuit $18_2$ and column address $R_{AD12}$ from address buffer 11 are inputted to redundancy switching information comparison circuit $62_1$ shown in the lower portion in FIG. 4. The output signals of redundancy switching information comparison circuits $61_1$ and $62_1$ and the output signal of fuse circuit $18_3$ are inputted to NAND circuit 63. Here, redundancy switching information regarding a column address in which the defective memory cells are present is written in fuse circuit $18_1$ and fuse circuit $18_2$, and redundancy switching information regarding whether or not redundancy switching control is performed for memory cell blocks $20_1$ and $20_2$ (the redundancy switching information has a high level when redundancy switching control is performed, but has a low level when redundancy switching control is not performed) is written in fuse circuit $18_3$.

The operation of redundancy switching control circuit block 60 of the present construction example will next be described.

In a read mode or a write mode, comparison between a column address represented by redundancy switching information sent thereto from fuse circuit $18_1$ and column address $R_{AD11}$ sent thereto from address buffer 11 is performed by redundancy switching information comparison circuit $61_1$ shown in the upper portion of FIG. 4. When they coincide with each other, an output signal of a high level is outputted, but when they do not coincide with each other, another output signal of a low level is outputted. Meanwhile, redundancy switching information comparison circuit $62_1$ shown in the lower portion in FIG. 4 compares a column address represented by redundancy switching information sent thereto from fuse circuit $18_2$ and column address $R_{AD12}$ sent thereto from address buffer 11, and outputs an output signal of a high level when they coincide, but outputs another output signal of a low level when they do not coincide with each other.

NAND circuit 63 outputs an output signal of a high level when all of the output signals of two redundancy switching information comparison circuits $61_1$ and $62_1$ and the output signal of fuse circuit $18_3$ have a high level, but outputs another output signal of a low level in any other case. In other words, the output signal of NAND circuit 63 exhibits a low level when the column address from fuse circuit 181 and column address $R_{AD11}$ coincide with each other and the column address from fuse circuit $18_2$ and column address $R_{AD12}$ coincide with each other, or when the redundancy switching information from fuse circuit $18_3$ indicates that redundancy switching control is performed.

The output signal of redundancy switching control circuit block 60 (that is, the output signal of NAND circuit 63) is inputted as a first control signal to redundancy switching circuit $14_1$ by way of first control signal line LC1. Redundancy switching circuit $14_1$ outputs data from column line spare memory cell block $21_1$ to sense amplifier $15_1$ when the output signal of redundancy switching control circuit block 60 sent thereto has a low level, but when the output signal of redundancy switching control circuit block 60 sent thereto has a high level, redundancy switching circuit $14_1$ outputs data from memory cell block $20_1$ to sense amplifier $15_1$.

It is to be noted that the output signal of fuse circuit $18_3$, the output signal of fuse circuit $18_4$, the output signal of fuse circuit $18_5$, column address $R_{AD21}$ and column address $R_{AD22}$ are inputted to the other redundancy switching control circuit block of redundancy switching control circuit 16, and the output signal of the last-mentioned redundancy switching control circuit block is inputted as a second control signal to redundancy switching circuit $14_2$ by way of second control signal line $L_{C2}$. The construction and operation of the redundancy switching control circuit block are similar to the construction and operation of redundancy switching control circuit block 60 described above, and accordingly, overlapping description thereof is omitted herein.

Figure 5:
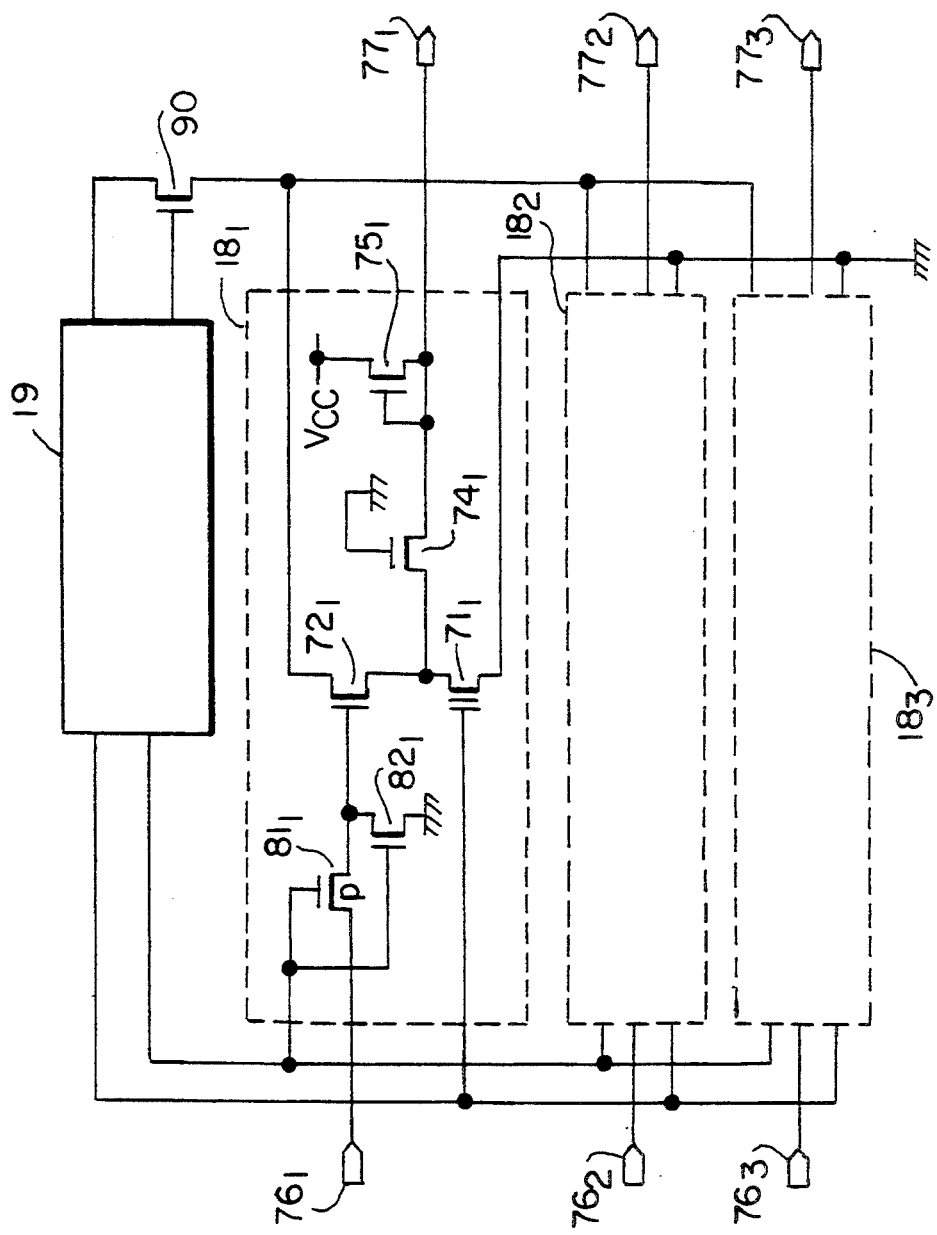
FIG. 5 is a block diagram showing another example of the construction of the fuse circuit shown in FIG. 2.

FIG. 5 is a block diagram showing another example of the construction of fuse circuit $18_1$ shown in FIG. 2. Fuse circuit $18_1$ of the present construction example is different from fuse circuit $18_1$ of the construction example shown in FIG. 3 in that, in order to allow second enhancement type transistor $53_1$ shown in FIG. 2, which requires larger dimensions, to be provided commonly to fuse circuits $18_1$ to $18_6$, fourth enhancement type transistor 90 formed from nMOS is provided between fuse circuit write voltage supply circuit 19 and fuse circuits $18_1$ to $18_6$. It is to be noted that, since fuse circuit $18_1$ of the present construction example allows realization of fuse circuits $18_1$ to $18_6$ having a smaller area but having the same function, the area occupied by the peripheral circuits can be further reduced.

Fuse circuit $18_1$ of the present construction example includes memory cell $71_1$, first enhancement transistor $72_1$ formed from nMOS, first depletion type transistor $74_1$ formed from nMOS, second depletion type transistor $75_1$ formed from nMOS, second enhancement type transistor $81_1$ formed from pMOS, and third enhancement type transistor $82_1$ formed from nMOS.

Here, memory cell $71_1$ is produced by the same process and has the same structure as the memory cells constituting memory cell blocks $20_1$ and $20_2$ shown in FIG. 2, and the source thereof is grounded. The source of first enhancement type transistor $72_1$ is connected to the drain of memory cell $71_1$. The drain of first enhancement type transistor $72_1$ is connected to the source of fourth enhancement type transistor 90 formed from nMOS. Meanwhile, the gate of first enhancement type transistor $72_1$ is connected to row pre-decoder $10_1$ by way of second enhancement type transistor $81_1$, input terminal $76_1$ and first pre-row line LPC1 shown in FIG. 2, and is grounded by way of third enhancement type transistor $82_1$. The gate of second enhancement type transistor $81_1$ and the gate of third enhancement type transistor $82_1$ are connected to each other.

The gate of memory cell $71_1$ and the gate of second enhancement type transistor $81_1$ (the gate of third enhancement type transistor $82_1$) are connected independently of each other to fuse circuit write voltage supply circuit 19. Meanwhile, the drain of memory cell $71_1$ is connected to output terminal $77_1$ by way of first depletion type transistor $74_1$, the gate of which is grounded. The gate and the drain of second depletion type transistor $75_1$ are connected to output terminal $77_1$, and the source of second depletion type transistor $75_1$ is normally held at power source voltage level $V_{CC}$.

It is to be noted that the drain and the gate of fourth enhancement type transistor 90 are connected independently of each other to fuse circuit write voltage supply circuit 19.

The operation of fuse circuit $18_1$ of the present construction example will next be described. However, since the operations of memory cell $71_1$, first enhancement type transistor $72_1$, first depletion type transistor $74_1$ and second depletion type transistor $75_1$ are the same as the operations of memory cell $51_1$, first enhancement type transistor $52_1$, first depletion type transistor $54_1$ and second depletion type transistor $55_1$ shown in FIG. 3, overlapping description thereof is omitted.

In a redundancy switching information write mode, high voltages for writing are applied from fuse circuit write voltage supply circuit 19 to the gate and the drain of fourth enhancement type transistor 90. Consequently, the gate of fourth enhancement type transistor 90 is set to a high level so that the fourth enhancement type transistor 90 is put into a conducting condition. As a result, a voltage necessary to write redundancy switching information is supplied to fuse circuit $18_1$ connected to the source of fourth enhancement type transistor 90. Further, in this instance, a voltage of a low level is applied from fuse circuit write voltage supply circuit 19 to the gate of second enhancement type transistor $81_1$ and the gate of third enhancement type transistor $82_1$. As a result, second enhancement type transistor $81_1$ is put into a conducting condition and third enhancement type transistor $82_1$ is put into a non-conducting condition. Consequently, write select control of fuse circuit $18_1$ can be performed in response to the output signal of row pre-decoder $10_1$.

In a redundancy switching information read mode, the gate of fourth enhancement type transistor 90 is grounded by fuse circuit write voltage supply circuit 19 so that fourth enhancement type transistor 90 is put into a non-conducting condition. It is to be noted that, in this instance, the voltage to be applied to the drain of fourth enhancement type transistor 90 may have any potential. Meanwhile, a voltage of a high level is applied from fuse circuit write voltage supply circuit 19 to the gate of second enhancement type transistor $81_1$ and the gate of third enhancement type transistor $82_1$. As a result, second enhancement type transistor $81_1$ is put into a non-conducting condition and third enhancement type transistor $82_1$ is put into a conducting condition, and consequently, the gate of first enhancement type transistor $72_1$ normally exhibits a low level.

Figure 6:
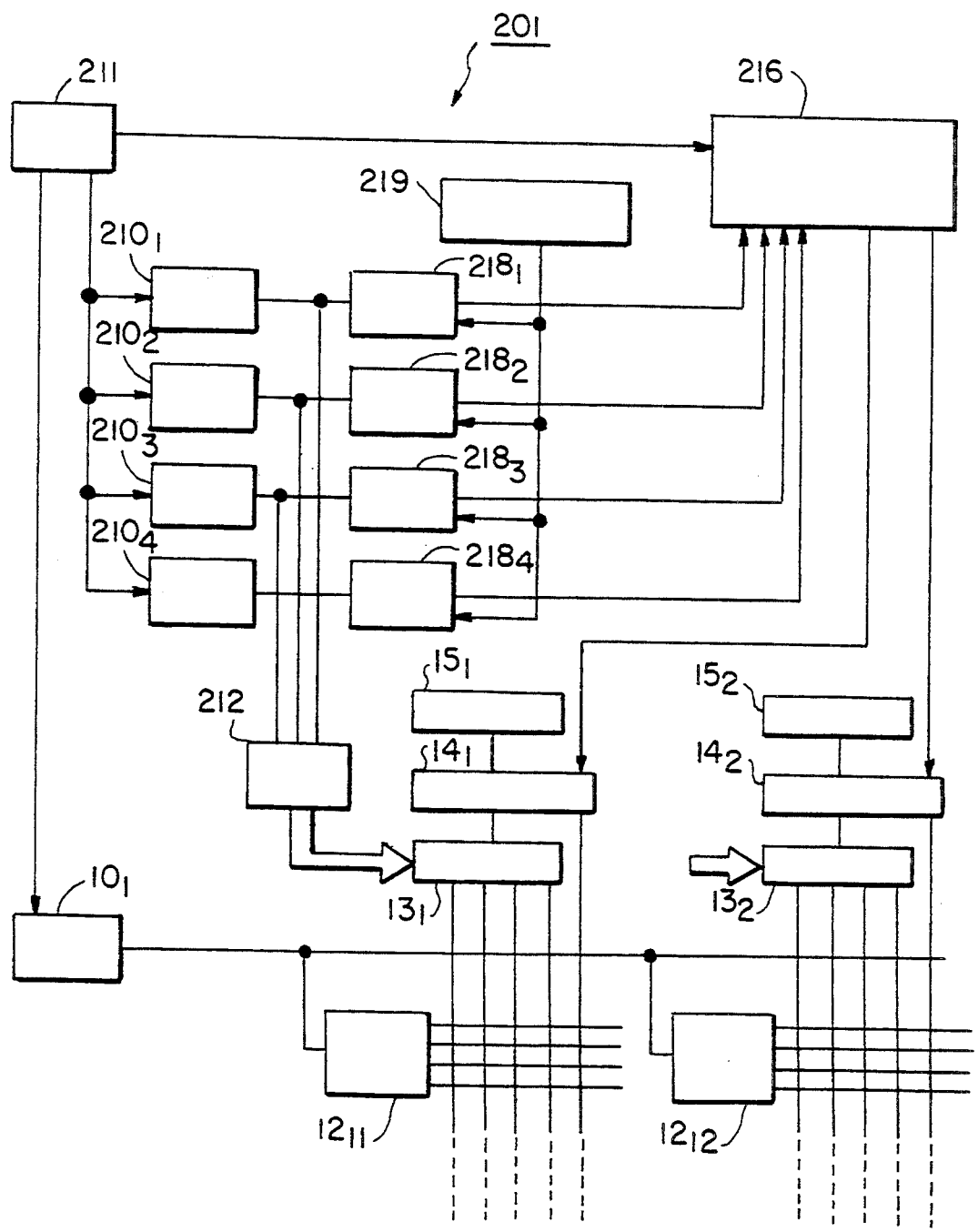
FIG. 6 is a block diagram showing the construction of an embodiment wherein column line memory cells including defective memory cells in a memory cell block are replaced with column line spare memory cells in a column line spare memory cell block.

FIG. 6 is a block diagram showing the construction of an embodiment wherein column line memory cells including defective memory cells in a memory cell block are replaced with column line spare memory cells in a column line spare memory cell block. In the embodiment shown in FIG. 6, column pre-decoder circuits $210_1$ to $210_4$ and fuse circuits $218_1$ to $218_4$ are connected in a one-to-one corresponding relationship to each other similarly to row pre-decoders $10_1$ to $10_6$ and fuse circuits $18_1$ to $18_6$ in the embodiment shown in FIG. 2. Row pre-decoder $10_1$, row decoders $12_{11}$ and $12_{12}$, column selectors $13_1$ and $13_2$, redundancy switching circuits $14_1$ and $14_2$ and sense amplifiers $15_1$ and $15_2$ in FIG. 6 are the same as to those shown in FIG. 2, and although not shown in FIG. 6, the other construction is the same as to that of the embodiment shown in FIG. 2.

Column pre-decoder circuits $210_1$ to $210_4$ receive an address signal from address buffer $21_1$ to select a fuse circuit. Into the thus-selected fuse circuit, redundancy switching information for a column is written by fuse circuit write voltage supply circuit $21_9$, and redundancy switching control circuit $21_6$ outputs the redundancy switching information written in the fuse circuits to redundancy switching circuits $14_1$ and $14_2$.

The semiconductor storage device of the present embodiment having the construction described above also exhibits similar effects to those of the embodiment shown in FIG. 1.

While the redundancy circuits in the semiconductor storage devices of the present invention described above are constructed so that column line memory cells including defective memory cells in a memory cell block are replaced with column line spare memory cells in a column line spare memory cell block, a similar construction can be employed for, and similar effects are exhibited by, an alternative redundancy circuit wherein row line memory cells including defective memory cells in a memory cell block are replaced with row line spare memory cells in a row line spare memory cell block, or a defective memory cell block in a plurality of memory cell blocks is replaced with a spare memory cell block, or a combination of those constructions is employed. It is to be noted that, while the following two semiconductor storage devices have been proposed as semiconductor storage devices by which reduction of the chip size can be achieved, the semiconductor storage device of the present invention can achieve still further reduction of the chip size.

(1) A semiconductor storage device wherein an address fuse latch in an address selector of a redundancy decoder is eliminated while a programming fuse is provided on a transmission line of an address signal to reduce the area of the redundancy decoder (Japanese Patent Laid-Open Application No. Showa 63-138599)

(2) A semiconductor storage device wherein both of a row line and a column line of a redundancy memory are switched at a time using either one of a row address roll circuit and a column address roll circuit to reduce address roll circuits to one half to thereby reduce the chip size (Japanese Patent Laid-Open Application No. Heisei 1-138698)

Since the present invention is constructed as described above, the following effect is exhibited: Since there is no necessity for a fuse circuit write control circuit and associated wiring lines which are conventionally required to write redundancy switching information into fuse circuits, the area of peripheral circuits can be reduced, and as a result, enhancement of the productivity can be achieved by an increase in the scale of the redundancy circuit.

What is claimed is:

1. A semiconductor storage circuit which includes a memory cell block in which memory cells formed from non-volatile transistors are arranged two-dimensionally,
   a spare memory cell block constituted from a plurality of spare memory cells to be replaced by defective memory cells produced in said memory cell block,
   a plurality of row pre-decoder circuits for selecting a row of said memory cell block,
   a plurality of fuse circuits which are constituted from fuse elements formed from non-volatile transistors of the same structure as those of said memory cells and which are adapted to write redundancy switching information therein,
   a fuse circuit write voltage supply circuit for supplying to said fuse circuits a voltage necessary to write redundancy switching information,
   a redundancy switching circuit for switching data from said memory cell block to data from said spare memory cell block, and
   a redundancy switching control circuit for referring to redundancy switching information written in said fuse circuits to provide to said redundancy switching circuit an instruction whether or not data from said memory cell block should be switched to data from said spare memory cell block,
   characterized in that:
      said plurality of row pre-decoder circuits and said plurality of fuse circuits are connected in a one-by-one corresponding relationship to each other, and
      one of said plurality of fuse circuits is selected by said one of plurality of row pre-decoder circuits and redundancy switching information is written into each of said fuse circuits.

2. A semiconductor storage device as claimed in claim 1, characterized in that an enhancement type transistor is provided between said fuse circuit write voltage supply circuit and said plurality of fuse circuits.

3. A semiconductor storage circuit which includes a memory cell block in which memory cells formed from non-volatile transistors are arranged two-dimensionally,
   a spare memory cell block constituted from a plurality of spare memory cells to be replaced by defective memory cells produced in said memory cell block,
   a plurality of column pre-decoder circuits for selecting a column of said memory cell block,
   a plurality of fuse circuits constituted from fuse elements formed from non-volatile transistors of the same structure as that of said memory cells and adapted to write redundancy switching information therein, a fuse circuit write voltage supply circuit for supplying to said fuse circuits a voltage necessary to write redundancy switching information, a redundancy switching circuit for switching data from said memory cell block to data from said spare memory cell block, and a redundancy switching control circuit for referring to redundancy switching information written in said fuse circuits to provide to said redundancy switching circuit an instruction whether or not data from said memory cell block should be switched to data from said spare memory cell block, characterized in that said plurality of column pre-decoder circuits and said plurality of fuse circuits are connected in a one-by-one corresponding relationship to each other, and one of said plurality of fuse circuits is selected by one of said plurality of column pre-decoder circuits and redundancy switching information is written into each of said fuse circuits.

4. A semiconductor storage device as claimed in claim 3 characterized in that an enhancement type transistor is provided between said fuse circuit write voltage supply circuit and said plurality of fuse circuits.

* * * * *